United States Patent
Kimura et al.

(10) Patent No.: US 11,276,820 B2
(45) Date of Patent: Mar. 15, 2022

(54) MEMRISTOR AND NEURAL NETWORK USING SAME

(71) Applicants: RYUKOKU UNIVERSITY, Otsu (JP); ROHM CO., LTD., Kyoto (JP)

(72) Inventors: Mutsumi Kimura, Otsu (JP); Sumio Sugisaki, Shiga (JP); Yoshinori Miyamae, Kyoto (JP)

(73) Assignees: RYUKOKU UNIVERSITY, Otsu (JP); ROHM CO., LTD., Kyoto (JP)

( * ) Notice: Subject to any disclaimer, the term of this patent is extended or adjusted under 35 U.S.C. 154(b) by 0 days.

(21) Appl. No.: 16/756,993

(22) PCT Filed: Oct. 19, 2018

(86) PCT No.: PCT/JP2018/039111
§ 371 (c)(1),
(2) Date: Apr. 17, 2020

(87) PCT Pub. No.: WO2019/078367
PCT Pub. Date: Apr. 25, 2019

(65) Prior Publication Data
US 2021/0036223 A1    Feb. 4, 2021

(30) Foreign Application Priority Data
Oct. 19, 2017    (JP) .............................. JP2017-202437

(51) Int. Cl.
*G06N 3/063* (2006.01)
*H01L 45/00* (2006.01)
(Continued)

(52) U.S. Cl.
CPC ............. *H01L 45/147* (2013.01); *G06N 3/04* (2013.01); *G11C 11/54* (2013.01);
(Continued)

(58) Field of Classification Search
CPC ....................................................... G06N 3/063
(Continued)

(56) References Cited

U.S. PATENT DOCUMENTS

| 8,779,409 B2 * | 7/2014 | Yang ................... H01L 45/1233 257/4 |
| 2012/0043517 A1 | 2/2012 | Sonehara |

(Continued)

FOREIGN PATENT DOCUMENTS

| JP | 2012-043896 A | 3/2012 |
| JP | 2013-546064 A | 12/2013 |

(Continued)

OTHER PUBLICATIONS

International Search Report for International Application No. PCT/JP2018/039111, dated Dec. 25, 2018, 1 pp.

*Primary Examiner* — Jason Lappas
(74) *Attorney, Agent, or Firm* — United IP Counselors, LLC

(57) ABSTRACT

Provided is a memristor that can be manufactured at a low temperature, and does not include metals of which resources might be depleted. This memristor includes a first electrode, a second electrode, and a memristor layer of an oxide having elements of Ga, Sn, and oxygen, disposed between the first electrode and the second electrode. When voltage is applied to the first electrode with respect to the second electrode, the voltage being positive or negative, a current flows; when voltage of a data-set voltage value is applied, a state is transitioned from a high-resistance state to a low-resistance state; and when voltage of a data-reset voltage value that is of an opposite sign to that of the data-set voltage value is applied, the state is transitioned from a low-resistance state to a high-resistance state.

20 Claims, 5 Drawing Sheets

(51) Int. Cl.
*G06N 3/04* (2006.01)
*G11C 11/54* (2006.01)
*G11C 13/00* (2006.01)
*H01L 27/24* (2006.01)
*H01L 29/786* (2006.01)

(52) U.S. Cl.
CPC ...... *G11C 13/0007* (2013.01); *G11C 13/0069* (2013.01); *H01L 27/2436* (2013.01); *H01L 27/2463* (2013.01); *H01L 29/78693* (2013.01); *H01L 45/08* (2013.01); *H01L 45/1233* (2013.01); *H01L 45/1253* (2013.01); *G11C 2013/009* (2013.01); *G11C 2213/31* (2013.01); *G11C 2213/79* (2013.01)

(58) Field of Classification Search
USPC .......................................... 706/15; 365/148
See application file for complete search history.

(56) References Cited

U.S. PATENT DOCUMENTS

| | | |
|---|---|---|
| 2012/0109866 A1 | 5/2012 | Modha |
| 2014/0153314 A1* | 6/2014 | Baker ............... G06F 30/392 |
| | | 365/148 |
| 2014/0332747 A1 | 11/2014 | Alekhin et al. |
| 2016/0004960 A1* | 1/2016 | Sa Ghi ............... G06N 3/0635 |
| | | 706/25 |
| 2016/0379110 A1 | 12/2016 | Eleftheriou et al. |
| 2018/0013061 A1 | 1/2018 | Fukumizu et al. |

FOREIGN PATENT DOCUMENTS

| | | |
|---|---|---|
| JP | 2015-502031 A | 1/2015 |
| JP | 2016-510501 A | 4/2016 |
| JP | 20118-6696 A | 1/2018 |
| JP | 2018-524698 A | 8/2018 |
| WO | 2012/055592 A1 | 5/2012 |
| WO | 2014/108215 A1 | 7/2014 |
| WO | 2017/001956 A1 | 1/2017 |

* cited by examiner

[Fig. 1]
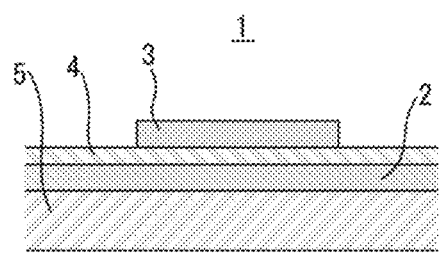
[Fig. 2]
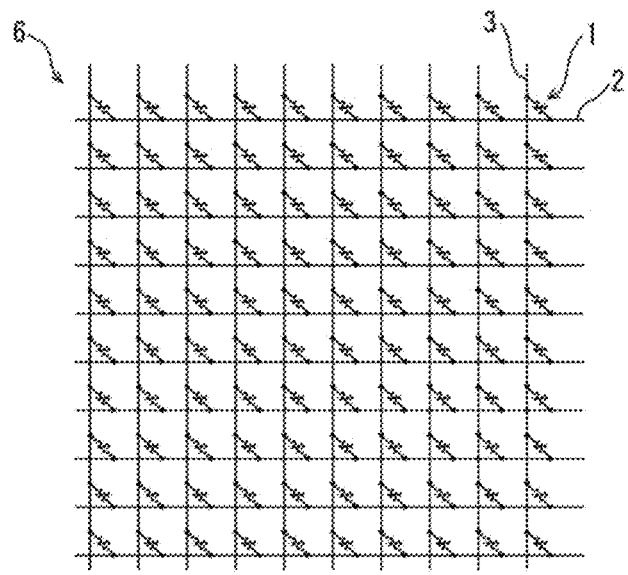

[Fig. 3]
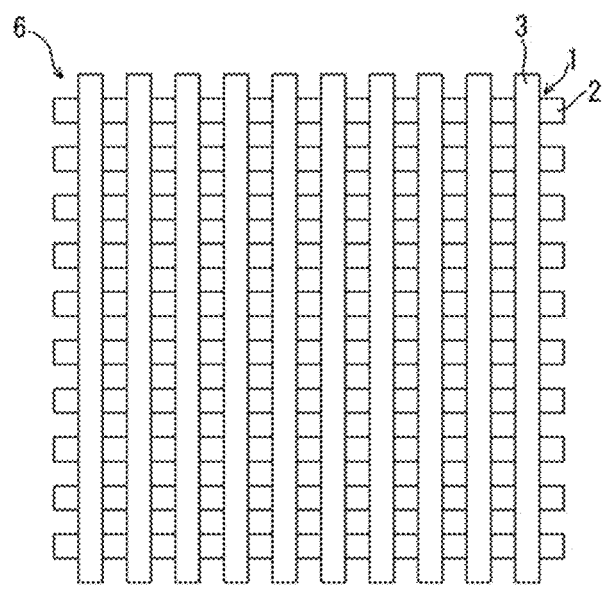

[Fig. 5]
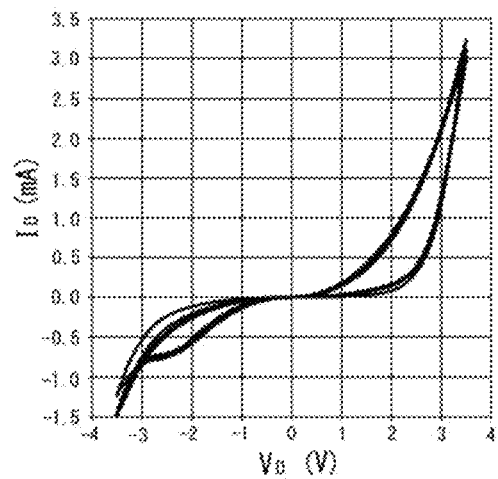
[Fig. 6]
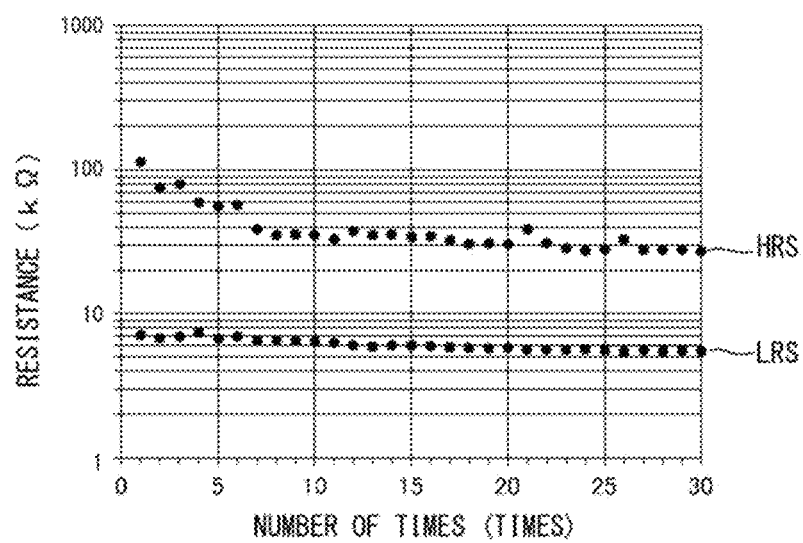

[Fig. 7]
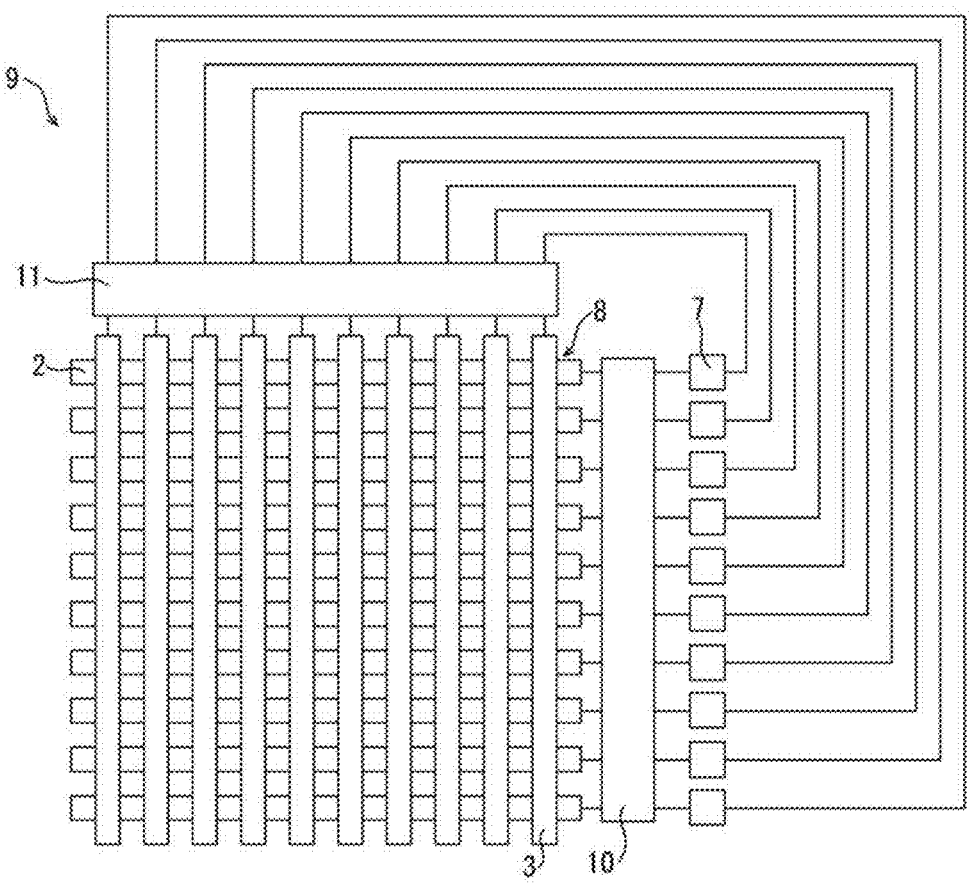
[Fig. 8]
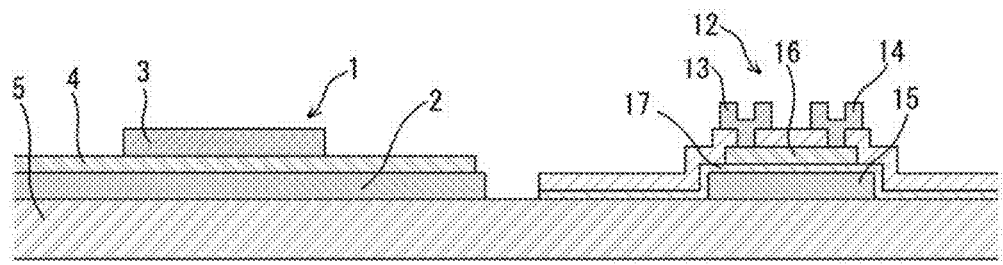

MEMRISTOR AND NEURAL NETWORK USING SAME

CROSS-REFERENCE TO RELATED APPLICATIONS

This application is the U.S. National Phase of International Application No. PCT/JP2018/039111, filed Oct. 19, 2018. That application claims priority to JP2017-202437, filed Oct. 19, 2017. Both of those application are incorporated by reference in their entireties.

TECHNICAL FIELD

The present invention relates to a memristor having an oxide, and a neural network using the same.

BACKGROUND ART

A memristor is a device that exhibits change in resistance value when current flows therethrough under predetermined conditions, and that is capable of maintaining that state. There is known a structure of a memristor where a memristor layer is disposed between a first electrode and a second electrode. For example, Japanese Translation of PCT Application No. 2015-502031 and Japanese Translation of PCT Application No. 2016-510501 disclose a Ti oxide as a typical memristor layer. The Ti oxide is single crystalline or polycrystalline. Japanese Translation of PCT Application No. 2015-502031 discloses, besides this, oxides having elements of Zr, Hf, V, Nb, Ta, Mo, W, Cr, Fe, Ni, Co, Sc, Y, or Lu, as a memristor layer. Japanese Translation of PCT Application No. 2016-510501 discloses, besides this, a Ta oxide or Nb oxide as a memristor layer. Such memristors can be used as memory devices in variable resistance memory (ReRAM) through integration, and also can be used as synapse devices that connect neuron circuits to each other in a neural network that mimics the structure of a brain (see Japanese Translation of PCT Application No. 2015-502031 and Japanese Translation of PCT Application No. 2016-510501).

BRIEF SUMMARY

A memristor that uses a Ti oxide memristor layer requires a high-temperature (e.g., temperatures of 200° C. to 300° C. or higher) process in manufacturing. Also, although much is unclear regarding the structures and manufacturing processes of memristors disclosed in Patent Document 1 and Patent Document 2 that use memristor layers of oxides having elements other than Ti, a process of 300° C. is used in an example described in Patent Document 1, and it is conceivable that a temperature around the same level as that of Ti oxides is required, as in this example.

Additionally, in a neural network, the number of synapse devices where memristors are applied is extremely great, and highly integrating these using a substrate that has a size as large as possible is preferable.

However, in a case of highly integrating using a substrate that is large in size, manufacturing by a process as low in temperature as possible instead of a high-temperature process is preferable from the perspective of manufacturing facilities, and it is preferable not to include metals of which resources might be depleted, to keep from becoming extremely expensive.

The present invention has been made in light of such situations, and it is an object thereof to provide a memristor that can be manufactured at lower temperatures and does not include metals of which resources might be depleted, and also to provide a neural network where high integration of synapse devices can be realized by using the same.

In order to achieve the above object, a memristor according to an embodiment of the present invention includes a first electrode, a second electrode, and a memristor layer of an oxide having elements of Ga, Sn, and oxygen, disposed between the first electrode and the second electrode. When voltage is applied to the first electrode with respect to the second electrode, the voltage being positive or negative, a current flows; when voltage of a data-set voltage value is applied, a state is transitioned from a high-resistance state to a low-resistance state; and when voltage of a data-reset voltage value that is of an opposite sign to that of the data-set voltage value is applied, the state is transitioned from a low-resistance state to a high-resistance state.

The oxide preferably is an amorphous oxide.

The first electrode and/or the second electrode preferably is/are formed by deposition of aluminum.

A neural network according to an embodiment of the present invention includes a plurality of neuron circuits and a plurality of synapse devices, the synapse devices including the memristor.

Alternatively, a neural network according to an embodiment of the present invention includes a plurality of neuron circuits and a plurality of synapse devices, the neuron circuits including the memristor.

Preferably, the plurality of synapse devices are arrayed in a matrix form, with a plurality of the synapse devices thereof laid out in a first direction having one of the first electrodes and the second electrodes thereof connected in common, and a plurality of the synapse devices laid out in a second direction having the other of the first electrodes and the second electrodes thereof connected in common, and each of the plurality of neuron circuits is connected to one of the first electrodes and the second electrodes connected in common, and is connected to the other of the first electrodes and the second electrodes connected in common.

Preferably, the neuron circuits have a thin-film transistor. The thin-film transistor includes a drain electrode, a source electrode, a gate electrode, and a channel layer. When voltage is applied across the drain electrode and the source electrode and across the gate electrode and the source electrode, a current corresponding to these voltages flows in the channel layer between the drain electrode and the source electrode. The channel layer uses the same layer as the memristor layer.

The memristor according to the present invention can be manufactured at lower temperatures and can be made not to include metals of which resources might be depleted. Also, in the neural network according to the present invention, high integration of synapse devices and so forth can be realized by using the memristor.

BRIEF DESCRIPTION OF DRAWINGS

FIG. 1 is a cross-sectional view illustrating a structure of a memristor according to an embodiment of the present invention.

FIG. 2 is a circuit diagram illustrating a memristor array configured of memristors the same as the above.

FIG. 3 is a planar view illustrating a memristor array configured of memristors the same as the above.

FIG. 4A is that of a first time, FIG. 4B a 10th time, FIG. 4C a 20th time, and FIG. 4D a 30th time.

FIG. 5 is a current-voltage characteristics diagram where current-voltage characteristics of FIG. 4A to FIG. 4D of the data-set/data-reset experimentation of memristors the same as the above are shown overlaid.

FIG. 6 is a characteristics diagram illustrating high-resistance state (HRS) and low-resistance state (LRS) resistance values as to the number of times of repeating data-set/data-reset in the experimentation of memristors the same as the above.

FIG. 7 is a planar view schematically illustrating a neural network using memristors the same as the above.

FIG. 8 is a cross-sectional view illustrating a structure of a neural network using memristors the same as the above and thin-film transistors.

DETAILED DESCRIPTION

Figure 4A:
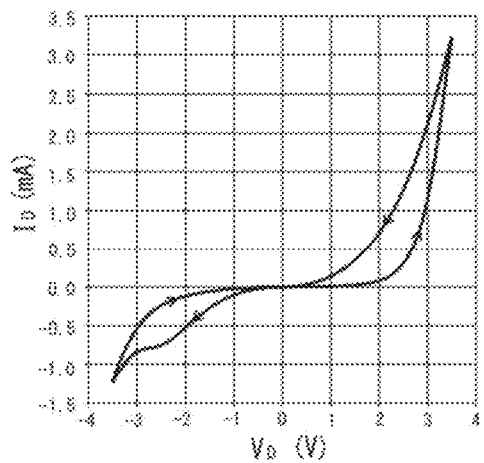
FIGS. 4A-4D are current-voltage characteristics diagrams in data-set/data-reset experimentation of memristors the same as the above, where

An embodiment for carrying out the present invention will be described below with reference to the figures. A memristor 1 according to the embodiment of the present invention is provided with a first electrode 2, a second electrode 3, and a memristor layer 4 disposed between the first electrode 2 and the second electrode 3, as illustrated in FIG. 1. This memristor 1 is formed on a substrate 5, such as a resin substrate, a glass substrate, or a flexible substrate such as polyethylene naphthalate film or the like. The memristor 1 may be formed on the substrate 5 with an insulating film interposed therebetween. FIG. 1 illustrates the first electrode 2, the memristor layer 4, and the second electrode 3 being formed on the substrate 5 in that order upward, but may be formed in the order of the second electrode 3, the memristor layer 4, and the first electrode 2.

Aluminum may be used for the first electrode 2 and the second electrode 3, although this is not restrictive in particular. Aluminum is inexpensive. Aluminum is deposited by vapor deposition, sputtering, or the like, and patterned into a necessary form thereafter or prior thereto, thereby forming the first electrode 2 or the second electrode 3. The first electrode 2 and the second electrode 3 can each be a plurality of layers. The first electrode 2 and the second electrode 3 can also be of different materials from each other. Note however, that in experimentation by the Inventors of the present application, some electrodes (first electrode 2 or second electrode 3) formed by intentionally mixing other matter into aluminum didn't exhibit good characteristics, and accordingly the electrodes are preferably formed using a material wherein the proportion of the number of atoms of other matter as to aluminum is no more than 10% (even more preferably, no more than 5%).

The memristor layer 4 is formed of an oxide made up of the elements Ga (gallium), Sn (tin), and oxygen. An amorphous oxide is well-suited for this oxide. An amorphous oxide made up of the elements Ga, Sn, and oxygen can be manufactured in a low-temperature (e.g., 25° C.) process. Also, Ga and Sn are elements which have conventionally been in widespread use in electronic devices, and are not elements of a metal like In (indium) for example, of which resources might be depleted. Accordingly, this memristor 1 using the memristor layer 4 can be highly integrated using the substrate 5 that is large in size, and costs can be suppressed as well. The ratio of number of atoms of Ga:Sn may be adjusted within a range of 1:5 to 5:1, for example. Note that the memristor layer 4 can also contain minute amounts of elements other than Ga, Sn, and oxygen, as long as the elements Ga, Sn, and oxygen are the primary components of the oxide. These minute amounts of elements are impurities unavoidably immixed or impurities intentionally immixed, with the proportion of the number of atoms thereof being no more than 5% of the total of Ga and Sn, for example.

When voltage, which is positive or negative with respect to the second electrode 3, is applied to the first electrode 2, a current flows in the memristor 1 at a portion between the first electrode 2 and the second electrode 3. When voltage of a data-set voltage value $V_{DST}$ (e.g., positive voltage) is applied, the memristor 1 can be made to transition from a high-resistance state to a low-resistance state, and when voltage of a data-reset voltage value $V_{DRST}$ (e.g., negative voltage) is applied, the memristor 1 can be made to transition from a low-resistance state to a high-resistance state, which will be shown by later-described characteristics of an evaluation sample. The data-set voltage value $V_{DST}$ and data-reset voltage value $V_{DRST}$ are of opposite polarity to each other.

Accordingly, the memristor 1 can store data by correlating the high-resistance state and low-resistance state to 0 and 1 or 1 and 0, and for example, data can be read out by applying the voltage of a readout voltage value $V_{DR}$ that is between the data-set voltage value $V_{DST}$ and 0 V and that does not cause transition from the high-resistance state to the low-resistance state. Note that the resistance value of the low-resistance state can be changed into several varieties by changing the data-set voltage value $V_{DST}$ to be applied or the like, thereby storing multi-value data, and the resistance value of the low-resistance state can be changed continuously in an analog manner, thereby storing data of continuous analog values.

A plurality of the memristors 1 can be arrayed in a matrix form to make up a memristor array 6, for example, as illustrated in FIG. 2 and FIG. 3. Now, in the plurality of memristors 1, a plurality of memristors 1 (10 memristors in the figure) laid out in a first direction (left-right direction in the figure) have the first electrodes 2 thereof connected in common, and a plurality of memristors 1 (10 memristors in the figure) laid out in a second direction (up-down direction in the figure) that is orthogonal to the first direction, have the second electrodes 3 thereof connected in common. Accordingly, in the memristor array 6, the first electrodes 2 connected in common to the plurality of memristors 1 (10 memristors in the figure) extend in the first direction (left-right direction in the figure), and a plurality thereof (10 memristors in the figure) are arrayed in parallel to each other, and the second electrodes 3 connected in common to the plurality of memristors 1 (10 memristors in the figure) extend in the second direction (up-down direction in the figure), and a plurality thereof (10 memristors in the figure) are arrayed in parallel to each other. Although a total of 100 is illustrated in FIG. 2 and FIG. 3 as the number of memristors 1 making up the memristor array 6, for the sake of convenience in illustration, various arrangement can be made. Also note that an arrangement can be made where the plurality of memristors 1 laid out in the first direction have the second electrodes 3 thereof connected in common, and the plurality of memristors 1 laid out in the second direction have the first electrodes 2 thereof connected in common.

The Inventors of the present application have manufactured an evaluation sample of the memristor array 6 and performed characteristics evaluation of the memristors 1, which will be described.

The Inventors of the present application manufactured the memristor array 6 for an evaluation sample as follows. First, 80 first electrodes 2, 150 μm in width and extending in the first direction, were formed in parallel, by patterning with a metal mask, from a film formed by vacuum vapor deposition on a substrate 5 that was a 3 mm×3 mm glass substrate (see FIG. 3). Next, a film was formed by RF magnetron sputtering using a two-inch sintered ceramic target, where gallium trioxide ($Ga_2O_3$) and stannic oxide ($SnO_2$) were mixed at a ratio of 1:3 regarding the number of atoms for Ga:Sn, thereby forming the memristor layer 4 of an amorphous oxide made up of the elements of Ga, Sn, and oxygen. Film formation conditions were film formation time of 3 min, input power of 60 W, Ar gas flow of 20 sccm, oxygen gas flow of 1 sccm, and film formation pressure of 5.0 Pa. Next, 80 second electrodes 3, 150 μm in width and extending in the second direction, were formed in parallel, by patterning with a metal mask, from a film formed by vacuum vapor deposition. Note that while a metal mask was used for patterning in the present characteristics evaluation, it is needless to say that a photomask normally used for mass production in semiconductor manufacturing processes can be used.

Electric characteristics of one of the plurality of memristors 1 making up the memristor array 6 manufactured in this way were evaluated using a semiconductor parameter analyzer, with voltage (bias voltage) applied to the first electrode 2 and the second electrode 3 grounded. A state was created where the first electrodes 2 and the second electrodes 3 other than the first electrode 2 and the second electrode 3 of the memristor 1 being evaluated would not affect the memristor 1 being evaluated.

Figure 4B:
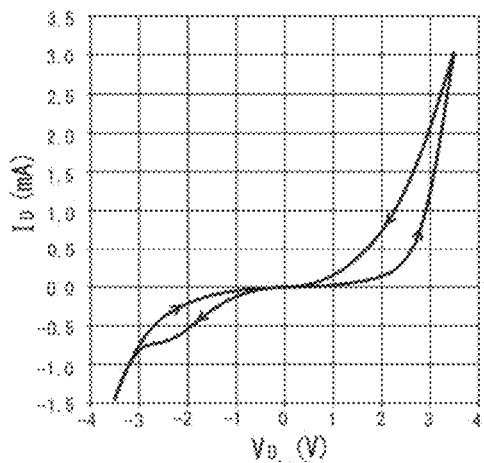
Figure 4C:
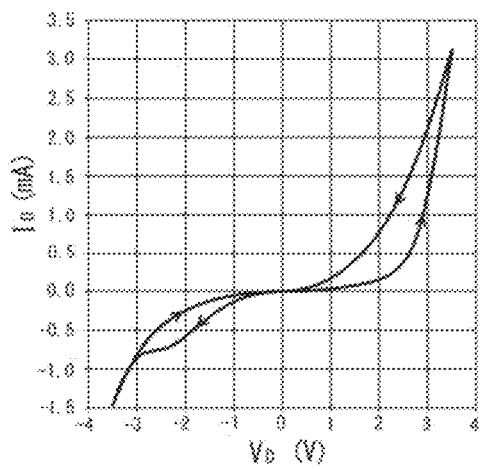
Figure 4D:
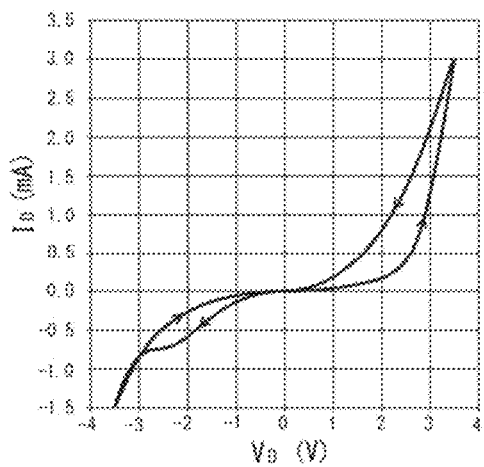

FIG. 4A illustrates experimentation results of current-voltage characteristics of the current (indicated by $I_D$) measured as voltage of the memristor 1 (indicated by $V_D$) is gradually increased from 0 V, then gradually reduced after reaching 3.5 V, and then gradually increased after reaching −3.5 V, to reach 0 V. The arrows in the figure indicate the change in current-voltage characteristics. Measurement was continued in the same way regarding the memristor 1, and the experimentation results at the tenth time, the 20th time, and the 30th time are shown in FIG. 4B to FIG. 4D. It can be seen from FIG. 4A that when the voltage of the memristor 1 reaches 3.5 V, the resistance value changes from a high-resistance state to a low-resistance state. It can also be seen that when the voltage of the memristor 1 reaches −3.5 V, the resistance value changes from a low-resistance state to a high-resistance state. The same can be seen from FIG. 4B to FIG. 4D as well.

FIG. 5 is an illustration where the curves of the experimentation results of current-voltage characteristics illustrated in FIG. 4A to FIG. 4D (four curves) are overlaid. It can be seen here that the high-resistance state and low-resistance state are obtained in a stable manner at positive voltage. It can also be seen that a current corresponding to the high-resistance state and low-resistance state flows in a positive voltage smaller than 3.5 V (e.g., 1 V), and the high-resistance state and low-resistance state can be distinguished in a stable manner by this current.

It can be seen from FIG. 4A to FIG. 4D and FIG. 5 that the data-set voltage value $V_{DST}$ can be 3.5 V, the data-reset voltage value $V_{DRST}$ can be −3.5 V, and the readout voltage value $V_{DR}$ can be 1 V, for example.

FIG. 6 illustrates the resistance values for high-resistance state (indicated by HRS in the figure) and low-resistance state (indicated by LRS in the figure) with the voltage is 1 V, for the total of 30 times of measurement including the above four times. The resistance value for the low-resistance state is approximately 5 kΩ to approximately 8 kΩ, and it can be seen that there is hardly any change from the first time. The resistance value for the high-resistance state decreases from approximately 100 kΩ at the first time to approximately 40 kΩ at the seventh time, but it can be seen that thereafter there is almost no change between approximately 30 kΩ and approximately 40 kΩ. Thus, it can be seen that there is change in the high-resistance state around the first few times, but overall, the difference in resistance values as to the low-resistance state is great, and that the high-resistance state and the low-resistance state can be distinguished in a stable manner.

The memristor 1 has thus been described above. The memristor 1 can be applied to a neural network 9 that is provided with a plurality of neuron circuits 7 and a plurality of synapse devices 8. In this case, each of the plurality of synapse devices 8 may be the memristors 1. Alternatively, the plurality of synapse devices 8 can each be configured from the memristors 1 and something else (e.g., a later-described thin-film transistor or the like). Such a neural network 9 uses the memristors 1 having the memristor layer 4 for the synapse devices 8, and accordingly the synapse devices 8 can be highly integrated using a large-sized substrate 5. Note that an arrangement can be made where each of the plurality of neuron circuits 7 includes a memristor 1, so that the state can be stored within the neuron circuit 7.

The plurality of synapse devices 8 can be arrayed in the same way as in the memristor array 6 described above. That is to say, the synapse devices 8 can be arrayed in a matrix as illustrated in FIG. 7, with a plurality of synapse devices 8 thereof laid out in a first direction (left-right direction in the figure) having the first electrodes 2 thereof connected in common, and a plurality of synapse devices 8 thereof laid out in a second direction (up-down direction in the figure) having the second electrodes 3 thereof connected in common. Also note that an arrangement can be made where the plurality of synapse devices 8 laid out in the first direction have the second electrodes 3 thereof connected in common, and the plurality of synapse devices 8 laid out in the second direction have the first electrodes 2 thereof connected in common.

Each of the plurality of neuron circuits 7 may be connected to the first electrodes 2 connected in common via a first-direction control circuit 10, and may be connected to the second electrodes 3 connected in common via a second-direction control circuit 11. In the neural network 9 illustrated in FIG. 7, each of the plurality of neuron circuits 7 is capable of being connected with all of the other neuron circuits 7 via the first-direction control circuit 10, a synapse device 8, and the second-direction control circuit 11, in accordance with the state of the synapse devices 8. Note that an arrangement can be made where each of the plurality of neuron circuits 7 is connected to the second electrodes 3 connected in common via the first-direction control circuit 10, and is connected to the first electrode 2 connected in common via the second-direction control circuit 11.

When performing data-set and when performing data-reset of each synapse device 8, the first-direction control circuit 10 controls voltage of the first electrodes 2 of the plurality of memristors 1 connected in common, and the second-direction control circuit 11 controls voltage of the second electrodes 3 of the plurality of memristors 1 connected in common.

Thin-film transistors 12 can be used for transistors making up the neuron circuits 7 (and the first-direction control circuit 10 and the second-direction control circuit 11). The thin-film transistor 12 is provided with a drain electrode 13, a source electrode 14, a gate electrode 15, and a channel layer 16. When voltage is applied across the drain electrode 13 and the source electrode 14 and across the gate electrode 15 and the source electrode 14, a current corresponding to these voltages flows in the channel layer 16 between the drain electrode 13 and the source electrode 14, and the thin-film transistor 12 can be formed on the same substrate 5 as the memristor 1, as illustrated in FIG. 8. Now, the channel layer 16 of the thin-film transistor 12 uses the same layer as the memristor layer 4 (a layer formed at the same time), i.e., a thin film of an oxide having the elements of Ga, Sn, and oxygen. Also, in the example illustrated in FIG. 8, the gate electrode 15 uses the same layer as the first electrode 2 (e.g., aluminum deposition layer), and the drain electrode 13 and the source electrode 14 use the same layer as the second electrode 3 (e.g., aluminum deposition layer). Note that the memristor 1 is illustrated disposed near the thin-film transistor 12 in FIG. 8, to facilitate understanding. Also, reference numeral 17 denotes a gate insulation film.

Thus, by using the same layer for the channel layer 16 of the thin-film transistor 12 as the memristor layer 4, the manufacturing process of the neural network 9 is simplified, manufacturing costs are suppressed, and further a large-size substrate 5 can be used more easily. Note that the Present Inventors have confirmed that the memristor layer 4 can be formed of a thin film of an amorphous oxide made up of the elements of Ga, Sn, and oxygen, as described above, and also that the channel layer 16 can be formed as well.

Although an embodiment of the present invention has been described above, the present invention is not restricted to the description made in the embodiment, and various design modifications may be made within the scope of matters set forth in the claims. For example, in some cases, the oxide having the elements of Ga, Sn, and oxygen forming the memristor layer 4 can be a polycrystalline oxide as long as the characteristics of the memristor 1 can be maintained, although this normally would require a high-temperature manufacturing process. The memristor 1 can also be applied to memory devices and so forth, for example, besides the neural network 9.

EXPLANATIONS OF REFERENCE NUMERALS

1 Memristor
2 First electrode
3 Second electrode
4 Memristor layer
5 Substrate
6 Memristor array
7 Neuron circuit
8 Synapse device
9 Neural network
10 First-direction control circuit
11 Second-direction control circuit
12 Thin-film transistor
13 Drain electrode
14 Source electrode
15 Gate electrode
16 Channel layer
17 Gate insulation film

The invention claimed is:
1. A memristor, comprising:
a first electrode;
a second electrode; and
a memristor layer of an oxide having elements of Ga, Sn, and oxygen, disposed between the first electrode and the second electrode, wherein, when voltage is applied to the first electrode with respect to the second electrode, the voltage being positive or negative, a current flows; when voltage of a data-set voltage value is applied, a state is transitioned from a high-resistance state to a low-resistance state; and when voltage of a data-reset voltage value that is of an opposite sign to that of the data-set voltage value is applied, the state is transitioned from a low-resistance state to a high-resistance state.

2. The memristor according to claim 1, wherein the oxide is an amorphous oxide.

3. The memristor according to claim 1, wherein the first electrode and/or the second electrode is/are formed by deposition of aluminum.

4. A neural network, comprising a plurality of neuron circuits; and a plurality of synapse devices, wherein the synapse devices include the memristor according to claim 1.

5. A neural network, comprising a plurality of neuron circuits; and a plurality of synapse devices, wherein the neuron circuits include the memristor according to claim 1.

6. The neural network according to claim 4, wherein the plurality of synapse devices are arrayed in a matrix form, with a plurality of the synapse devices thereof laid out in a first direction having one of the first electrodes and the second electrodes thereof connected in common, and a plurality of the synapse devices laid out in a second direction having the other of the first electrodes and the second electrodes thereof connected in common, and
each of the plurality of neuron circuits is connected to one of the first electrodes and the second electrodes connected in common, and is connected to the other of the first electrodes and the second electrodes connected in common.

7. The neural network according to claim 4, wherein the neuron circuits have a thin-film transistor;
the thin-film transistor includes
a drain electrode,
a source electrode,
a gate electrode, and
a channel layer where, when voltage is applied across the drain electrode and the source electrode and across the gate electrode and the source electrode, a current corresponding to these voltages flows between the drain electrode and the source electrode; and;
the channel layer uses the same layer as the memristor layer.

8. The memristor according to claim 2, wherein the first electrode and/or the second electrode is/are formed by deposition of aluminum.

9. A neural network, comprising a plurality of neuron circuits; and a plurality of synapse devices, wherein the synapse devices include the memristor according to claim 2.

10. A neural network, comprising a plurality of neuron circuits; and a plurality of synapse devices, wherein the synapse devices include the memristor according to claim 3.

11. A neural network, comprising a plurality of neuron circuits; and a plurality of synapse devices, wherein the synapse devices include the memristor according to claim 8.

12. A neural network, comprising a plurality of neuron circuits; and a plurality of synapse devices, wherein the neuron circuits include the memristor according to claim 2.

13. A neural network, comprising a plurality of neuron circuits; and a plurality of synapse devices, wherein
the neuron circuits include the memristor according to claim 3.

14. A neural network, comprising a plurality of neuron circuits; and a plurality of synapse devices, wherein
the neuron circuits include the memristor according to claim 8.

15. The neural network according to claim 5, wherein
the plurality of synapse devices are arrayed in a matrix form, with a plurality of the synapse devices thereof laid out in a first direction having one of the first electrodes and the second electrodes thereof connected in common, and a plurality of the synapse devices laid out in a second direction having the other of the first electrodes and the second electrodes thereof connected in common, and
each of the plurality of neuron circuits is connected to one of the first electrodes and the second electrodes connected in common, and is connected to the other of the first electrodes and the second electrodes connected in common.

16. The neural network according to claim 5, wherein
the neuron circuits have a thin-film transistor;
the thin-film transistor includes
a drain electrode,
a source electrode,
a gate electrode, and
a channel layer where, when voltage is applied across the drain electrode and the source electrode and across the gate electrode and the source electrode, a current corresponding to these voltages flows between the drain electrode and the source electrode; and;
the channel layer uses the same layer as the memristor layer.

17. The neural network according to claim 6, wherein
the neuron circuits have a thin-film transistor;
the thin-film transistor includes
a drain electrode,
a source electrode,
a gate electrode, and
a channel layer where, when voltage is applied across the drain electrode and the source electrode and across the gate electrode and the source electrode, a current corresponding to these voltages flows between the drain electrode and the source electrode; and;
the channel layer uses the same layer as the memristor layer.

18. The neural network according to claim 9, wherein
the neuron circuits have a thin-film transistor;
the thin-film transistor includes
a drain electrode,
a source electrode,
a gate electrode, and
a channel layer where, when voltage is applied across the drain electrode and the source electrode and across the gate electrode and the source electrode, a current corresponding to these voltages flows between the drain electrode and the source electrode; and;
the channel layer uses the same layer as the memristor layer.

19. The neural network according to claim 10, wherein
the neuron circuits have a thin-film transistor;
the thin-film transistor includes
a drain electrode,
a source electrode,
a gate electrode, and
a channel layer where, when voltage is applied across the drain electrode and the source electrode and across the gate electrode and the source electrode, a current corresponding to these voltages flows between the drain electrode and the source electrode; and;
the channel layer uses the same layer as the memristor layer.

20. The neural network according to claim 11, wherein
the neuron circuits have a thin-film transistor;
the thin-film transistor includes
a drain electrode,
a source electrode,
a gate electrode, and
a channel layer where, when voltage is applied across the drain electrode and the source electrode and across the gate electrode and the source electrode, a current corresponding to these voltages flows between the drain electrode and the source electrode; and;
the channel layer uses the same layer as the memristor layer.

* * * * *